(12) United States Patent
Sun et al.

(10) Patent No.: US 11,843,391 B2
(45) Date of Patent: Dec. 12, 2023

(54) TEMPERATURE FEEDBACK CONTROL APPARATUS, METHOD, AND SYSTEM

(71) Applicant: Huawei Technologies Co., Ltd., Guangdong (CN)

(72) Inventors: Xu Sun, Shenzhen (CN); Jiao Wang, Dongguan (CN); Yuchen Liu, Wuhan (CN); Rui Li, Shenzhen (CN); Nguyen Binh Le, Shenzhen (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 114 days.

(21) Appl. No.: 17/448,113

(22) Filed: Sep. 20, 2021

(65) Prior Publication Data

US 2022/0006466 A1 Jan. 6, 2022

Related U.S. Application Data

(63) Continuation of application No. PCT/CN2020/072921, filed on Jan. 19, 2020.

(30) Foreign Application Priority Data

Mar. 21, 2019 (CN) .......................... 201910218518.5

(51) Int. Cl.
*H03M 1/06* (2006.01)
*H03M 1/08* (2006.01)
*G02F 7/00* (2006.01)

(52) U.S. Cl.
CPC .............. *H03M 1/089* (2013.01); *G02F 7/00* (2013.01); *H03M 1/0818* (2013.01); *H03M 1/0863* (2013.01)

(58) Field of Classification Search
CPC .... H01S 5/0687; H01S 3/1303; H01S 3/1305; H01S 5/4025; G02B 6/26; G02B 6/4201;
(Continued)

(56) References Cited

U.S. PATENT DOCUMENTS 5,504,608 A * 4/1996 Neeves .............. G02B 6/29395
398/79
6,389,046 B1 * 5/2002 Stayt, Jr. ............. H01S 5/06832
372/38.1
(Continued)

FOREIGN PATENT DOCUMENTS

CN 1396739 A 2/2003
CN 201828394 U 5/2011
(Continued)

*Primary Examiner* — Linh V Nguyen
(74) *Attorney, Agent, or Firm* — WOMBLE BOND DICKINSON (US) LLP

(57) ABSTRACT

This application discloses a temperature feedback control apparatus, method. The method includes two electric switches, a feedback control unit and an optical component. A first electric switch is configured to control that only a first channel of at least two channels that correspond to the first electric switch is conducted at a moment, to feed back an optical signal of a target optical component connected to the first channel to the feedback control unit. The feedback control unit is configured to calculate temperature of the corresponding optical component based on an electrical signal converted from the optical signal, to obtain a control signal. The second electric switch is configured to control, when the first channel is conducted, that only the second channel is conducted, to transmit the control signal to the target optical component to adjust its temperature. The optical component connects to both the first and second channels.

15 Claims, 5 Drawing Sheets

(58) Field of Classification Search
CPC .. G02B 6/4215; G02B 6/4245; G02B 6/4286; H03M 1/0863; H03M 1/0818; H03M 1/089
USPC .......................... 341/119, 155, 110; 398/34
See application file for complete search history.

(56) References Cited

U.S. PATENT DOCUMENTS

| | | | | |
|---|---|---|---|---|
| 6,493,125 B1* | 12/2002 | Tanaka | ................ | H04B 10/572 398/95 |
| 6,501,773 B1* | 12/2002 | Volz | ................ | H01S 5/0687 372/29.01 |
| 6,693,932 B2* | 2/2004 | Akashi | ................ | H01S 5/0687 372/20 |
| 6,760,532 B1* | 7/2004 | Livas | ................ | H04B 10/077 385/140 |
| 6,785,308 B2* | 8/2004 | Dyer | ................ | H04B 10/508 372/32 |
| 7,961,766 B2* | 6/2011 | Chen | ................ | H01S 5/0687 372/38.01 |
| 8,699,533 B1* | 4/2014 | Wach | ................ | H01S 5/02212 372/34 |
| 2003/0011841 A1* | 1/2003 | Lee | ................ | H01S 5/0687 398/79 |
| 2007/0092177 A1* | 4/2007 | Nilsson | ................ | H04B 10/50 385/14 |
| 2011/0103415 A1 | 5/2011 | Rasras | | |
| 2016/0261351 A1* | 9/2016 | Raybon | ................ | H04B 10/079 |
| 2019/0221998 A1* | 7/2019 | Nishita | ................ | H01S 5/0687 |

FOREIGN PATENT DOCUMENTS

| | | |
|---|---|---|
| CN | 102539010 A | 7/2012 |
| CN | 104506233 A | 4/2015 |
| CN | 206611011 U | 11/2017 |
| WO | 0199242 A1 | 12/2001 |

\* cited by examiner

US 11,843,391 B2

TEMPERATURE FEEDBACK CONTROL APPARATUS, METHOD, AND SYSTEM

CROSS-REFERENCE TO RELATED APPLICATIONS

This application is a continuation of International Patent Application No. PCT/CN2020/072921, filed on Jan. 19, 2020, which claims priority to Chinese Patent Application No. 201910218518.5, filed on Mar. 21, 2019. The disclosures of the aforementioned applications are hereby incorporated by reference in their entireties.

TECHNICAL FIELD

This application relates to the field of optical communications technologies, and in particular, to a temperature feedback control apparatus, method, and system.

BACKGROUND

An optical communications technology is widely used in the short-range communications field. In a communication process, an optical component is made of a material (such as silicon) with a relatively high thermo-optic coefficient. In other words, the optical component is comparatively sensitive to an ambient temperature. Therefore, monitoring a temperature of the optical component is an indispensable technical means.

At present, monitoring through optical splitting is widely used in the industry to monitor the temperature of the optical component. For multi-channel optical signals, each optical signal is controlled by a temperature monitoring system, resulting in complex temperature monitoring systems. In addition, a coexistence of a plurality of temperature monitoring systems also increases system dimensions and power consumption.

SUMMARY

Embodiments of this application provide a temperature feedback control apparatus, method, and system, to simplify complexity of a temperature monitoring system of an optical component and reduce dimensions and power consumption of an optical communications system.

To achieve the foregoing technical objective, the embodiments of this application provide the following technical solutions.

According to a first aspect, this application provides a temperature feedback control apparatus, where the apparatus includes a first electric switch, a second electric switch, a feedback control unit, and an optical component. Both the first electric switch and the second electric switch are multi-channel electric switches. One end of the feedback control unit is connected to at least two optical components, and the second electric switch is connected to the other end of the feedback control unit. One channel of the first electric switch is connected to one optical component, and one channel of the second electric switch is connected to one optical component. The first electric switch is configured to control that only a first channel is conducted at a moment, to feed back an optical signal of a target optical component connected to the first channel to a feedback control unit, where the first channel is a channel of at least two channels corresponding to the first electric switch. The feedback control unit is configured to convert the optical signal into an electrical signal, and calculate a temperature of the corresponding optical component based on the electrical signal, to obtain a control signal. The second electric switch is configured to control, when the first channel is conducted, that only a second channel is conducted, to transmit the control signal to the target optical component, and adjust the temperature of the target optical component. The optical component connected to the second channel and the optical component connected to the first channel are a same optical component.

In one embodiment, the temperature feedback control apparatus further includes a clock, where one end of the clock is connected to the first electric switch, and the other end of the clock is connected to the second electric switch. The clock is configured to synchronize the first electric switch and the second electric switch. In this embodiment, a synchronization clock is used to synchronize the first electric switch and the second electric switch. In this way, moments at which the first channel is conducted and the second channel is conducted can be accurately controlled, achieving precise control. It should be noted that, in this solution, synchronization between the first electric switch and the second electric switch is controlled by the synchronization clock. In a specific implementation, there may be one or two clocks. When there are two clocks, the two clocks need to be synchronization clocks.

In one embodiment, the temperature feedback control apparatus further includes an optical switch. The optical switch is disposed on a signal channel between the first electric switch and the target optical component. In other words, the optical switch is disposed on the first channel. In addition, the optical switch is connected to the feedback control unit, and is configured to feed back, when the first channel is conducted, an optical signal corresponding to the target optical component to the feedback control unit. It should be understood that a quantity of optical components is equal to a quantity of optical switches. Because an optical signal of each optical component needs to be transmitted to the feedback control unit through a corresponding signal channel, one optical component needs to be disposed on a signal channel between the first electric switch and each optical component.

In one embodiment, the temperature feedback control apparatus further includes a digital-to-analog converter (DAC). The digital-to-analog converter is disposed on a signal channel between the second electric switch and the target optical component. In other words, the digital-to-analog converter is disposed on the second channel. The digital-to-analog converter is configured to: when the second channel is conducted, convert the received control signal into a first analog signal, and output the first analog signal to the target optical component. Similar to the foregoing optical switch, a quantity of digital-to-analog converters is also equal to the quantity of optical components.

In one embodiment, the feedback control unit includes a photoelectric detector, a trans-impedance amplifier (TIA), an analog-to-digital converter (ADC), and a temperature control unit (TCU). The photoelectric detector is configured to convert the optical signal of the target optical component into a current signal. The trans-impedance amplifier is configured to convert the current signal into a voltage signal. The analog-to-digital converter is configured to convert the voltage signal into a digital signal. The temperature control unit is configured to calculate and obtain the temperature of the target optical component based on the digital signal, to obtain the control signal.

According to a second aspect, this application provides a temperature feedback control method. The method is applicable to a temperature feedback control apparatus, where the apparatus includes a first electric switch, a second electric switch, a feedback control unit, and an optical component. Both the first electric switch and the second electric switch are multi-channel electric switches. One end of the feedback control unit is connected to at least two optical components, and the second electric switch is connected to the other end of the feedback control unit. One channel of the first electric switch is connected to one optical component, and one channel of the second electric switch is connected to one optical component. The method includes: The first electric switch controls that only a first channel is conducted at a moment, to feed back an optical signal of a target optical component connected to the first channel to a feedback control unit, where the first channel is a channel of at least two channels corresponding to the first electric switch. The first electric switch is a multi-channel electric switch. The feedback control unit converts the optical signal into an electrical signal, and calculates a temperature of the corresponding optical component based on the electrical signal, to obtain a control signal. The second electric switch controls, when the first channel is conducted, that only a second channel is conducted, to transmit the control signal to the target optical component, and adjust the temperature of the target optical component. The optical component connected to the second channel and the optical component connected to the first channel are a same optical component. The second electric switch is a multi-channel electric switch.

For specific implementation of the second aspect, refer to the possible implementation of the first aspect. Details are not described herein again.

According to a third aspect, this application provides a temperature feedback control system. The temperature control feedback control system includes the temperature feedback control apparatus according to any one of the first aspect and the possible implementations of the first aspect.

According to a fourth aspect, this application provides a chip. The chip includes the temperature feedback control apparatus according to any one of the first aspect and the possible implementations of the first aspect. In one embodiment, the chip may be a silicon photonic chip.

For technical effects brought by any implementation in the second aspect, third aspect, and fourth aspect, refer to the technical effects brought by different implementations in the first aspect. Details are not described herein again.

DESCRIPTION OF EMBODIMENTS

Embodiments of this application provide a temperature feedback control apparatus, method, and system, to simplify complexity of a temperature monitoring system of an optical component and reduce dimensions and power consumption of an optical communications system. The following clearly and describes the technical solutions in this application with reference to the accompanying drawings in this application. It is clear that the described embodiments are merely a part of embodiments rather than all of the embodiments in this application.

In the specification, claims, and accompanying drawings of this application, the terms "first", "second", "third", "fourth", and the like (if any) are intended to distinguish between similar objects but do not necessarily indicate a specific order or sequence. It should be understood that the data used in such a way are interchangeable in proper circumstances so that the embodiments described herein can be implemented in other orders than the order illustrated or described herein. Moreover, the terms "include", "have" and any other variants mean to cover the non-exclusive inclusion, for example, a process, method, system, product, or device that includes a list of operations or units is not necessarily limited to those operations or units, but may include other operations or units not expressly listed or inherent to such a process, method, system, product, or device.

Figure 1:
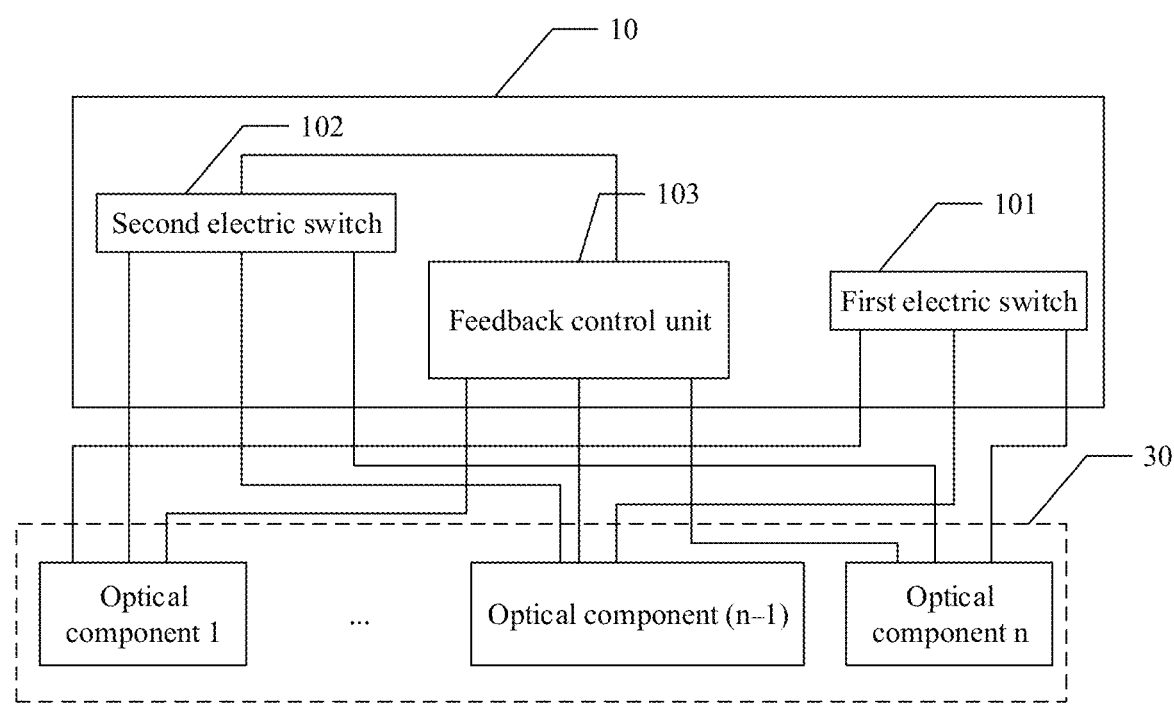
FIG. 1 is a schematic diagram of a temperature feedback control apparatus according to an embodiment of this application.

To facilitate understanding of the temperature feedback control apparatus, method, and system in the embodiments of this application, the following describes the temperature feedback control apparatus, method, and system in detail. Details are as follows:

FIG. 1 is a schematic diagram of a temperature feedback control apparatus according to an embodiment of this application.

As shown in FIG. 1, the temperature feedback control apparatus 10 in this embodiment of this application includes a first electric switch 101, a second electric switch 102, and a feedback control unit 103. In addition, to describe a function and a structure of the apparatus 10, FIG. 1 further shows an optical component set 30, and the optical component set 30 includes n optical components, where n is an integer greater than or equal to 2. In other words, the optical component set 30 includes two or more optical components. Both the first electric switch 101 and the second electric switch 102 are multi-channel electric switches. One end of the feedback control unit 103 is connected to each optical component in the optical component set 30, and the other end of the feedback control unit 103 is connected to the second electric switch 102. Similarly, one channel of the first electric switch 101 is connected to one optical component in the optical component set 30. It should be understood that a quantity of channels of the first electric switch 101 and a quantity of channels of the second electric switch 102 are not less than a quantity of optical components in the optical component set 30.

Functions of the first electric switch 101, the second electric switch 102, and the feedback control unit 103 in the temperature feedback control apparatus shown in FIG. 1 are as follows:

The first electric switch 101 is configured to control that only a first channel is conducted at a moment, to feed back an optical signal of a target optical component that is in the optical component set 30 and that is connected to the first channel to the feedback control unit 103, where the first channel refers to any one of a plurality of channels corresponding to the first electric switch. A plurality of channels means two or more channels.

The feedback control unit 103 is configured to receive the optical signal from the target optical component that is in the optical component set 30 and that is connected to the first channel, convert the optical signal into a corresponding electrical signal, and calculate a temperature of the corresponding optical component based on the electrical signal obtained through conversion, to obtain a control signal.

The second electric switch 102 is configured to control, when the first channel is conducted, that a second channel between the target optical component and the second electric switch 102 is conducted, and control that another channel between the target optical component and the second electric switch 102 is disconnected. The temperature of the target optical component is adjusted by applying the control signal to the target optical component. It should be understood that the first channel is a signal channel between the first electric switch 101 and the target optical component, and the second channel is a signal channel between the second electric switch 102 and the target optical component. For example, the first channel may be a signal channel between the first electric switch 101 and the optical component 1 in the optical component set 30, a signal channel between the first electric switch 101 and the optical component (n−1) in the optical component set 30, or a signal channel between the first electric switch 101 and the optical component n in the optical component set 30.

In one embodiment, the temperature feedback control apparatus further includes a clock, where one end of the clock is connected to the first electric switch, and the other end of the clock is connected to the second electric switch. The clock is configured to synchronize the first electric switch and the second electric switch. In this embodiment, a synchronization clock is used to synchronize the first electric switch and the second electric switch. In this way, moments at which the first channel is conducted and the second channel is conducted can be accurately controlled, achieving precise control. It should be noted that, in this solution, synchronization between the first electric switch and the second electric switch is controlled by the synchronization clock. In a specific implementation, there may be one or two clocks. When there are two clocks, the two clocks need to be synchronization clocks.

In one embodiment, the temperature feedback control apparatus further includes an optical switch. The optical switch is disposed on a signal channel between the first electric switch and the target optical component. In other words, the optical switch is disposed on the first channel. In addition, the optical switch is connected to the feedback control unit, and is configured to feed back, when the first channel is conducted, an optical signal corresponding to the target optical component to the feedback control unit. It should be understood that a quantity of optical components is equal to a quantity of optical switches. Because an optical signal of each optical component needs to be transmitted to the feedback control unit through a corresponding signal channel, one optical component needs to be disposed on a signal channel between the first electric switch and each optical component.

In one embodiment, the temperature feedback control apparatus further includes a digital-to-analog converter (DAC). The digital-to-analog converter is disposed on a signal channel between the second electric switch and the target optical component. In other words, the digital-to-analog converter is disposed on the second channel. The digital-to-analog converter is configured to: when the second channel is conducted, convert the received control signal into a first analog signal, and output the first analog signal to the target optical component. Similar to the foregoing optical switch, a quantity of digital-to-analog converters is also equal to the quantity of optical components.

In one embodiment, the feedback control unit includes a photoelectric detector, a trans-impedance amplifier (TIA), an analog-to-digital converter (ADC), and a temperature control unit (TCU). The photoelectric detector is configured to convert the optical signal of the target optical component into a current signal. The trans-impedance amplifier is configured to convert the current signal into a voltage signal. The analog-to-digital converter is configured to convert the voltage signal into a digital signal. The temperature control unit is configured to calculate and obtain the temperature of the target optical component based on the digital signal, to obtain the control signal.

In this embodiment of this application, the temperature feedback control apparatus including the first electric switch, the second electric switch, and the feedback control unit can perform temperature control on each optical component of the at least two optical components. It should be understood that, according to the temperature feedback control apparatus in this embodiment of this application, temperature control can be performed on a plurality of optical component channels by using one apparatus, simplifying complexity of a temperature monitoring system of an optical component, and reducing dimensions and power consumption of an optical communications system.

Figure 2:
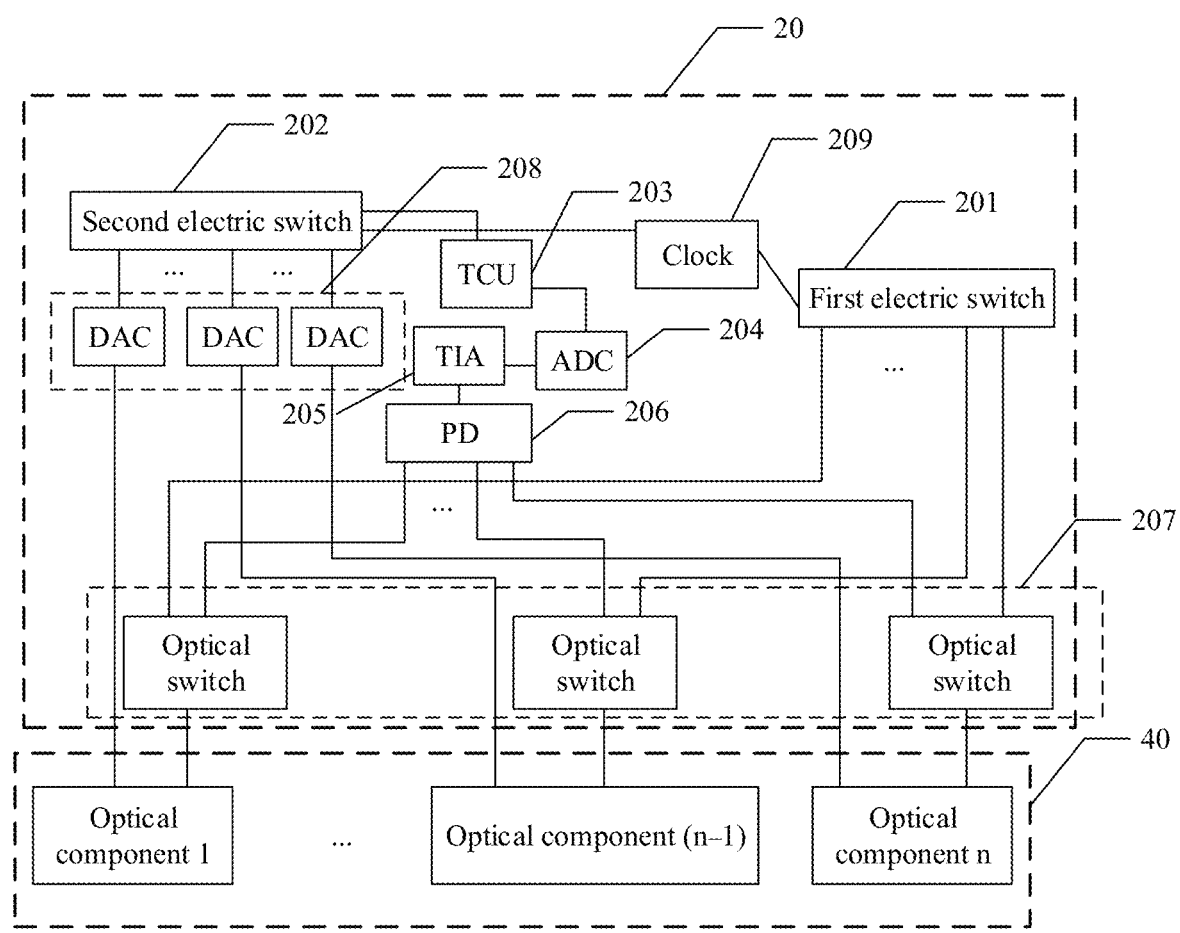
FIG. 2 is a schematic diagram of another temperature feedback control apparatus according to an embodiment of this application.

FIG. 2 is a schematic diagram of another temperature feedback control apparatus according to an embodiment of this application.

As shown in FIG. 2, the temperature feedback control apparatus 20 in this embodiment of this application includes a first electric switch 201, a second electric switch 202, a temperature control unit TCU 203, an analog-to-digital converter ADC 204, a trans-impedance amplifier TIA 205, a photodiode (PD) 206, an optical switch set 207, a digital-to-analog converter DAC set 208, and a clock 209. In addition, FIG. 2 further shows an optical component set 40, where the optical component set 40 includes n optical components. A quantity of optical switches in the optical switch set 207 is equal to a quantity of optical components in the optical component set 40. A quantity of DACs in the digital-to-analog converter DAC set 208 is also equal to the quantity of optical components in the optical component set 40.

It should be noted that the feedback control unit 103 in FIG. 1 may specifically be the temperature control unit TCU 203, the analog-to-digital converter ADC 204, the trans-impedance amplifier TIA 205, and the photodiode (PD) 206. It should be noted that the photoelectric detector may specifically include but is not limited to the photodiode PD.

It should be further noted that, for related descriptions of the temperature feedback control apparatus in FIG. 2, refer to the related descriptions in the corresponding possible implementation in FIG. 1. Details are not described herein again.

In this embodiment of this application, a same clock controls two multi-channel electric switches, where the first electric switch controls multiple optical switches, so that only one optical switch is conducted at a time. The second electric switch is connected to a digital-to-analog converter of each channel, and controls that only one digital-to-analog converter can receive a feedback signal of the temperature control unit at a time. According to this method, if a time of adjusting a temperature of a multi-channel optical component is longer than a time of photoelectric detection->analog-to-digital conversion->feedback voltage calculation->digital-to-analog conversion->thermal adjustment of a single channel, the multi-channel optical component may be adjusted. This simplifies complexity of a temperature monitoring system of an optical component and reduces dimensions and power consumption of an optical communications system.

The optical component in this embodiment of this application may usually be a temperature-sensitive device in an optical communications system, for example, an optical component such as a microring or a Mach-Zehnder interferometer (MZI) that is adjusted through optical splitting detection feedback. The following separately describes the temperature feedback control apparatus in this embodiment by using application scenarios in which the optical component is the microring in a multi-channel microring modulator array monitoring system, and in which the optical component is the MZI in a multi-channel parallel MZI/MZM communications system. MZM indicates the Mach-Zehnder modulator.

Figure 3:
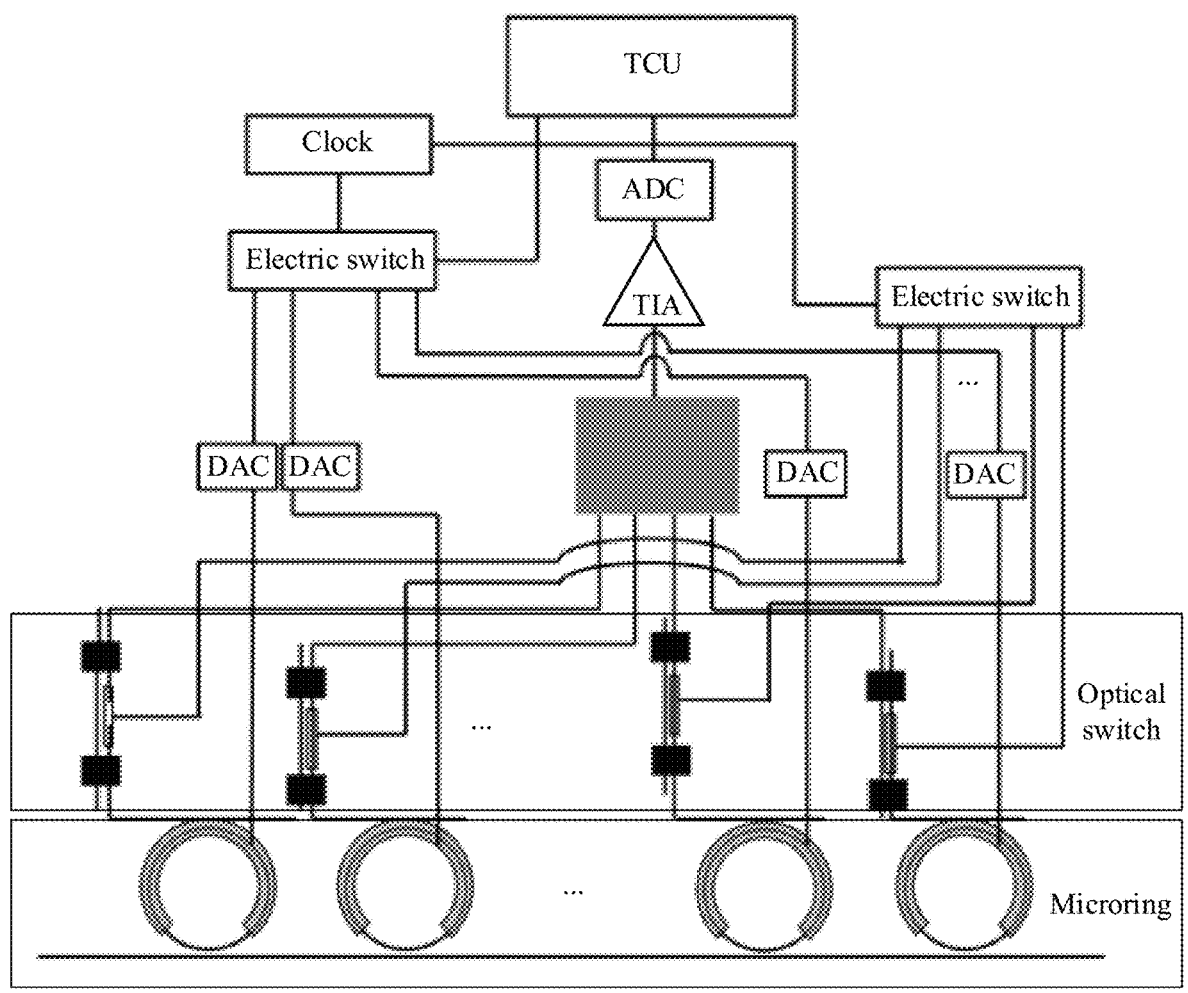
FIG. 3 is a schematic diagram of a multi-channel microring modulator array monitoring system according to an embodiment of this application.

FIG. 3 is a schematic diagram of a multi-channel microring modulator array monitoring system according to an embodiment of this application.

As shown in FIG. 3, FIG. 3 illustrates an embodiment of a multi-channel microring modulator array monitoring system. It can be seen that microrings of channels share a set of a photodetector PD, a trans-impedance amplifier TIA, an analog-to-digital converter ADC, and a temperature control unit TCU. Two electric switches respectively control an optical switch and a temperature controller of each channel. Through a clock polling mechanism, only one optical switch of one channel is turned on at a time, and temperature control can be performed only for this channel.

It should be noted that, in this embodiment, the photodiode PD in FIG. 3 may be flip-chip encapsulated. A monitoring light of each channel is directly incident to a silicon germanium photodiode PD in a silicon photonic chip through a grating coupler. However, this is not limited in this solution. Another type of photodiode PD may also be flip-chip encapsulated as shown in the embodiment corresponding to FIG. 2.

It should be further noted that the analog to digital converter ADC, the feedback control unit, the clock, the optical switch, and the like may all be integrated into a microcontroller unit (MCU), and costs and power consumption of the microcontroller unit are shared by multiple channels. This embodiment of this application provides only one multi-channel polling monitoring method, and do not relate to a specific optical or electrical component.

Figure 4:
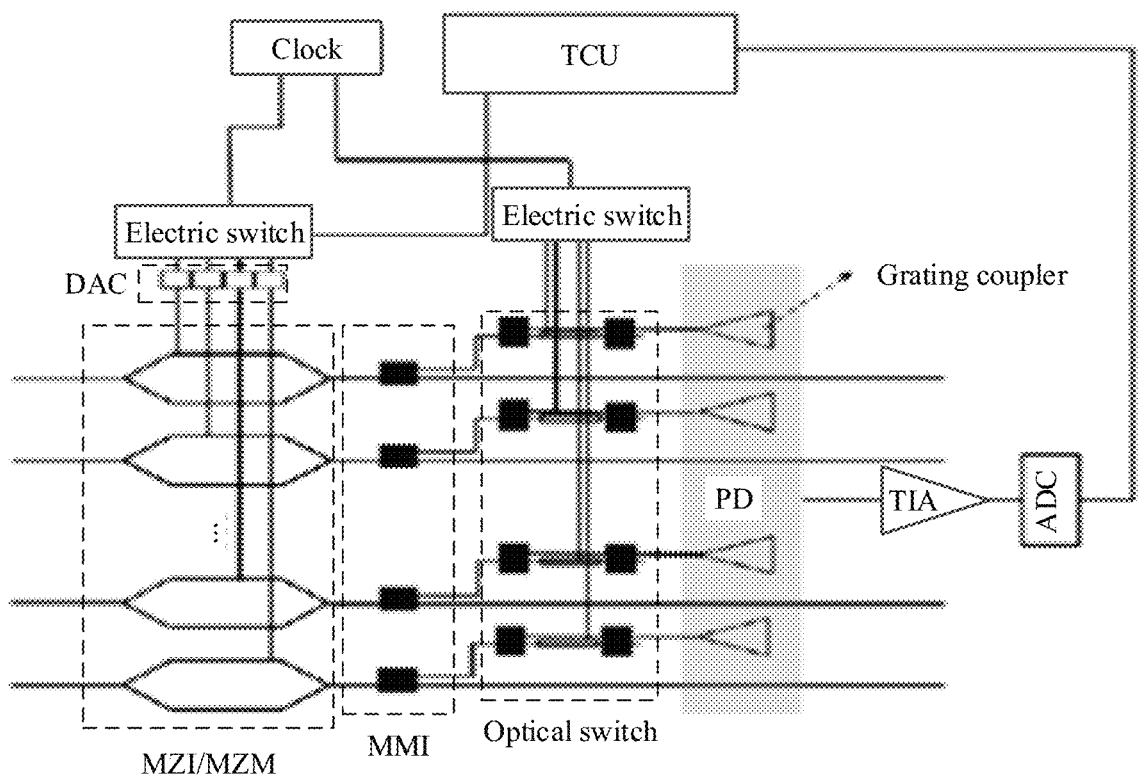
FIG. 4 is a schematic diagram of a multi-channel parallel MZI/MZM communications system according to an embodiment of this application.

FIG. 4 is a schematic diagram of a multi-channel parallel MZI/MZM communications system according to an embodiment of this application.

As shown in FIG. 4, FIG. 4 shows implementation of polling monitoring on a multi-channel parallel MZI/MZM communications system according to this solution. After passing through the MZI/MZM, an optical signal is split by a Multi-mode interferometer (MMI), and a small part of light enters an optical switch. After the optical switch of a channel is turned on, the split light enters a monitoring photodiode PD located above through a grating coupler. Photocurrent received by the photodiode PD enters an analog-to-digital converter ADC and a temperature control unit TCU through a trans-impedance amplifier. A feedback adjustment signal is used to perform feedback adjustment on the MZI/MZM of the channel by using an electric switch. The two switches are controlled by a same clock, so that a monitored channel is consistent with a feedback adjustment channel.

The foregoing describes in detail a structure of the temperature feedback control apparatus provided in the embodiments of this application. The following describes in detail a temperature feedback control method provided in the embodiments of this application.

Figure 5:
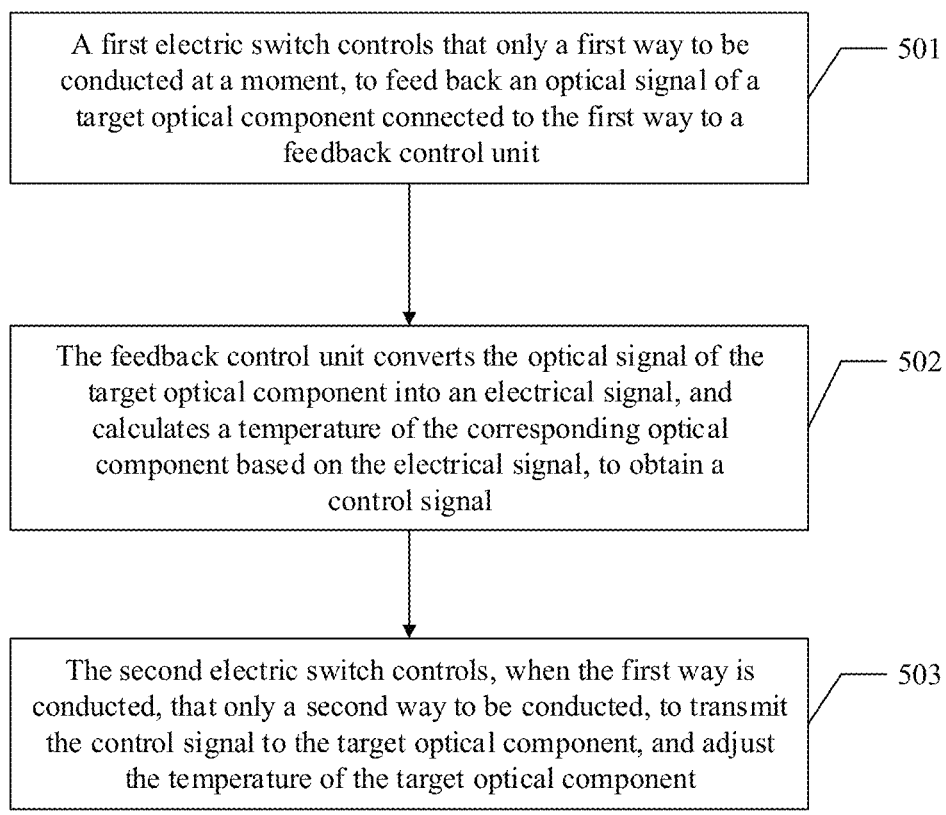
FIG. 5 is a schematic flowchart of a temperature feedback control method according to an embodiment of this application.

FIG. 5 is a schematic flowchart of the temperature feedback control method according to an embodiment of this application.

As shown in FIG. 5, the temperature feedback control method in this embodiment of this application includes the following operations.

501: A first electric switch controls that only a first channel is conducted at a moment, to feed back an optical signal of a target optical component connected to the first channel to a feedback control unit.

502: The feedback control unit converts the optical signal of the target optical component into an electrical signal, and calculates a temperature of the corresponding optical component based on the electrical signal, to obtain a control signal.

503: The second electric switch controls, when the first channel is conducted, that only a second channel is conducted, to transmit the control signal to the target optical component, and adjust the temperature of the target optical component.

The method in FIG. 5 is applicable to the apparatus in FIG. 1 to FIG. 4. For the method in FIG. 5, refer to related descriptions of the corresponding apparatus in FIG. 1 to FIG. 4. Specifically, for descriptions of operation 501, 502 and 503, respectively refer to related descriptions of the first electric switch, the feedback control unit, and the second electric switch in FIG. 1 to FIG. 4. Details are not described herein again.

An embodiment of this application further provides a temperature feedback control system. The temperature feedback control system includes the temperature feedback control apparatus described in FIG. 1 to FIG. 4. Specifically, the temperature feedback control system may include but is not limited to the multi-channel microring modulator array monitoring system in FIG. 3, or the multi-channel parallel MZI/MZM communications system.

An embodiment of this application further provides a chip. The chip includes the temperature feedback control apparatus described in FIG. 1 to FIG. 4. Specifically, the chip may integrate an analog to digital converter ADC, a feedback control unit, a clock, or an optical switch into a micro control unit MCU. This is not limited in this application.

It may be clearly understood by a person skilled in the art that, for ease and brevity of description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiments are merely examples. For example, division into the units is merely logical function division. There may be another division manner during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one location, or may be distributed on a plurality of network units. Some or all of the units may be selected based on actual requirements to achieve the objectives of the solutions in the embodiments.

In addition, the functional units in the embodiments of this application may be integrated into one processing unit, or each of the units may exist alone physically, or two or more units may be integrated into one unit. The integrated unit may be implemented in a form of hardware, or may be implemented in a form of a software functional unit.

When the integrated unit is implemented in a form of a software functional unit and sold or used as an independent product, the integrated unit may be stored in a computer-readable storage medium. Based on such an understanding, the technical solutions of this application essentially, or the part contributing to the conventional technology, or all or some of the technical solutions may be implemented in the form of a software product. The computer software product is stored in a storage medium and includes several instructions for instructing a computer device (which may be a personal computer, a server, a network device, or the like) to perform all or some of the operations of the methods described in the embodiments of this application.

In conclusion, the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. A temperature feedback control apparatus comprising:
   a first electric switch;
   a second electric switch, wherein both the first electric switch and the second electric switch are multi-channel electric switches; and
   a feedback control unit,
   wherein one end of the feedback control unit is connected to at least two optical components, wherein the second electric switch is connected to the other end of the feedback control unit, wherein one channel of the first electric switch is connected to one optical component of the at least two optical components, and wherein one channel of the second electric switch is connected to one optical component of the at least two optical components;
   wherein the first electric switch is configured to control that only a first channel is conducted at a moment, to feed back an optical signal of a target optical component connected to the first channel to the feedback control unit, wherein the first channel is a signal channel between the target optical component and the first electric switch, and the target optical component is any one of the at least two optical components;
   wherein the feedback control unit is configured to convert the optical signal into an electrical signal, and calculate a temperature of the corresponding optical component based on the electrical signal, to obtain a control signal; and
   wherein the second electric switch is configured to control, in response to the first channel being conducted, that only a second channel is conducted, to transmit the control signal to the target optical component, and adjust the temperature of the target optical component, wherein the second channel is a signal channel between the target optical component and the second electric switch.

2. The apparatus according to claim 1, further comprising:
   a clock, wherein one end of the clock is connected to the first electric switch, the other end of the clock is connected to the second electric switch, and wherein the clock is configured to synchronize the first electric switch and the second electric switch.

3. The apparatus according to claim 1, further comprising:
   an optical switch disposed on a channel between the first electric switch and the target optical component, wherein the optical switch is connected to the feedback control unit, and
   wherein the optical switch is configured to feed back, in response to the first channel being conducted, the optical signal of the target optical component to the feedback control unit.

4. The apparatus according to claim 1, further comprising:
   a digital-to-analog converter disposed on a channel between the second electric switch and the target optical component;
   wherein the digital-to-analog converter is configured to:
      in response to the second channel being conducted, convert the control signal into a first analog signal, and output the first analog signal to the target optical component.

5. The apparatus according to claim 1, wherein the feedback control unit comprises a photoelectric detector, a trans-impedance amplifier, an analog-to-digital converter, and a temperature control unit;
   wherein the photoelectric detector is configured to convert the optical signal of the target optical component into a current signal;
   wherein the trans-impedance amplifier is configured to convert the current signal into a voltage signal;
   wherein the analog-to-digital converter is configured to convert the voltage signal into a digital signal; and
   wherein the temperature control unit is configured to calculate and obtain the temperature of the target optical component based on the digital signal, to obtain the control signal.

6. A temperature feedback control method applicable to a temperature feedback control apparatus, the method comprising:
   controlling, by a first electric switch, that only a first channel is conducted at a moment, to feed back an optical signal of a target optical component connected to the first channel to a feedback control unit, wherein the temperature feedback control apparatus comprises the first electric switch, a second electric switch, and the feedback control unit, wherein both the first electric switch and the second electric switch are multi-channel electric switches, one end of the feedback control unit is connected to at least two optical components, the second electric switch is connected to the other end of the feedback control unit, one channel of the first electric switch is connected to one optical component of the at least two optical components, and one channel of the second electric switch is connected to one optical component of the at least two optical components, wherein the first channel is a signal channel between the target optical component and the first electric switch, wherein the first electric switch is a multi-channel electric switch, and wherein the target optical component is any one of the at least two optical components;

converting, by the feedback control unit, the optical signal of the target optical component into an electrical signal, and calculating a temperature of the corresponding optical component based on the electrical signal, to obtain a control signal; and controlling, by the second electric switch in response to the first channel being conducted, that only a second channel is conducted, to transmit the control signal to the target optical component, and adjusting the temperature of the target optical component, wherein the second channel is a signal channel between the target optical component and the second electric switch, and the second electric switch is a multi-channel electric switch.

7. The method according to claim 6, further comprising: synchronizing, by a clock, the first electric switch and the second electric switch, wherein one end of the clock is connected to the first electric switch, and the other end of the clock is connected to the second electric switch.

8. The method according to claim 6, further comprising: feeding back, by an optical switch in response to the first channel being conducted, the optical signal of the target optical component to the feedback control unit, wherein the optical switch is disposed on a channel between the first electric switch and the target optical component, and the optical switch is connected to the feedback control unit.

9. The method according to claim 6, further comprising: converting, by a digital-to-analog converter in response to the second channel being conducted, the received control signal into a first analog signal, and outputting the first analog signal to the target optical component, wherein the digital-to-analog converter is disposed on a channel between the second electric switch and the target optical component.

10. The method according to claim 6, wherein the feedback control unit comprises a photoelectric detector, a trans-impedance amplifier, an analog-to-digital converter, and a temperature control unit, wherein the converting, by the feedback control unit, the optical signal of the target optical component into an electrical signal, and calculating a temperature of the corresponding optical component based on the electrical signal, to obtain a control signal comprises:

converting, by the photoelectric detector, the optical signal of the target optical component into a current signal;

converting, by the trans-impedance amplifier, the current signal into a voltage signal;

converting, by the analog-to-digital converter, the voltage signal into a digital signal; and calculating and obtaining, by the temperature control unit, the temperature of the target optical component based on the digital signal, to obtain the control signal.

11. A chip, wherein the chip comprises a temperature feedback control apparatus comprising:

a first electric switch, a second electric switch, and a feedback control unit, wherein both the first electric switch and the second electric switch are multi-channel electric switches;

wherein one end of the feedback control unit is connected to at least two optical components, the second electric switch is connected to the other end of the feedback control unit, one channel of the first electric switch is connected to one optical component of the at least two optical components, and one channel of the second electric switch is connected to one optical component of the at least two optical components;

wherein the first electric switch is configured to control that only a first channel is conducted at a moment, to feed back an optical signal of a target optical component connected to the first channel to the feedback control unit, wherein the first channel is a signal channel between the target optical component and the first electric switch, and the target optical component is any one of the at least two optical components;

wherein the feedback control unit is configured to convert the optical signal into an electrical signal, and calculate a temperature of the corresponding optical component based on the electrical signal, to obtain a control signal; and wherein the second electric switch is configured to control, in response to the first channel being conducted, that only a second channel is conducted, to transmit the control signal to the target optical component, and adjust the temperature of the target optical component, wherein the second channel is a signal channel between the target optical component and the second electric switch.

12. The chip according to claim 11, wherein the temperature feedback control apparatus further comprises a clock, wherein one end of the clock is connected to the first electric switch, the other end of the clock is connected to the second electric switch, and wherein the clock is configured to synchronize the first electric switch and the second electric switch.

13. The chip according to claim 11, wherein the temperature feedback control apparatus further comprises an optical switch disposed on a channel between the first electric switch and the target optical component, wherein the optical switch is connected to the feedback control unit, and wherein the optical switch is configured to feed back, in response to the first channel being conducted, the optical signal of the target optical component to the feedback control unit.

14. The chip according to claim 11, wherein the temperature feedback control apparatus further comprises a digital-to-analog converter disposed on a channel between the second electric switch and the target optical component; wherein the digital-to-analog converter is configured to: in response to the second channel being conducted, convert the control signal into a first analog signal, and output the first analog signal to the target optical component.

15. The chip according to claim 11, wherein the feedback control unit comprises a photoelectric detector, a trans-impedance amplifier, an analog-to-digital converter, and a temperature control unit;

wherein the photoelectric detector is configured to convert the optical signal of the target optical component into a current signal;

wherein the trans-impedance amplifier is configured to convert the current signal into a voltage signal;

wherein the analog-to-digital converter is configured to convert the voltage signal into a digital signal; and wherein the temperature control unit is configured to calculate and obtain the temperature of the target optical component based on the digital signal, to obtain the control signal.

* * * * *